(12) United States Patent
Wei

(10) Patent No.: US 11,411,101 B2
(45) Date of Patent: Aug. 9, 2022

(54) MANUFACTURING METHOD OF TFT SUBSTRATE

(71) Applicant: SHENZHEN CHINA STAR OPTOELECTRONICS TECHNOLOGY CO., LTD., Guangdong (CN)

(72) Inventor: Xianwang Wei, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 245 days.

(21) Appl. No.: 16/609,440

(22) PCT Filed: Jun. 18, 2019

(86) PCT No.: PCT/CN2019/091722
§ 371 (c)(1),
(2) Date: Oct. 29, 2019

(87) PCT Pub. No.: WO2020/232784
PCT Pub. Date: Nov. 26, 2020

(65) Prior Publication Data
US 2021/0336040 A1    Oct. 28, 2021

(30) Foreign Application Priority Data
May 22, 2019   (CN) .......................... 201910431502.2

(51) Int. Cl.
*H01L 27/00* (2006.01)
*H01L 29/00* (2006.01)
(Continued)

(52) U.S. Cl.
CPC .... *H01L 29/66969* (2013.01); *H01L 27/1225* (2013.01); *H01L 27/1288* (2013.01)

(58) Field of Classification Search
CPC ............. H01L 27/1225; H01L 27/1288; H01L 27/3262; H01L 27/3246; H01L 27/3248;
(Continued)

(56) References Cited

U.S. PATENT DOCUMENTS

| | | | | |
|---|---|---|---|---|
| 4,956,680 A | * | 9/1990 | Tanaka | H01L 27/12 257/20 |
| 2009/0224250 A1 | | 9/2009 | Kisdarjono et al. | |
| 2016/0013243 A1 | * | 1/2016 | O'Rourke | H01L 31/028 257/43 |

FOREIGN PATENT DOCUMENTS

| | | |
|---|---|---|
| CN | 100437980 C | 11/2008 |
| CN | 107204377 A | 9/2017 |
| CN | 107275412 A | 10/2017 |

* cited by examiner

*Primary Examiner* — Nikolay K Yushin

(57) ABSTRACT

A TFT substrate and a manufacturing method thereof are provided. In the manufacturing method, a metal oxide semiconductor layer is irradiated with UV light by using a gate as a shielding layer, such that a portion of the metal oxide semiconductor layer irradiated by the UV light is conductorized to form a source, a drain, and a pixel electrode, and a portion of the metal oxide semiconductor layer shielded by the gate still retains semiconductor properties to form a semiconductor channel. The invention achieves the alignment of the source and the drain with the gate by processes of self-alignment of the gate and conductorization of the metal oxide semiconductor layer, and can effectively control an overlapping region of the source and drain and the gate. Thereby, the parasitic capacitance is reduced, and the display quality is improved. Also, the manufacturing method is simple, and the production efficiency is improved.

5 Claims, 4 Drawing Sheets

(51) Int. Cl.
*H01L 29/66* (2006.01)
*H01L 27/12* (2006.01)

(58) Field of Classification Search
CPC ........... H01L 29/66969; H01L 29/7869; H01L 29/41733; H01L 29/78633
See application file for complete search history.

provide a base substrate, deposit a metal oxide semiconductor layer on thebase substrate, and pattern the metal oxide semiconductor layer to obtain a first preliminary pattern and a second preliminary pattern connected to each other ~S1 deposit a first metal layer, and pattern the first metal layer to obtain a connecting block connected to the first preliminary pattern, heat the connecting block, thereby inducing the first preliminary pattern in contact with the connecting block to be conductorized ~S2 deposit a gate insulating layer and a second metal layer sequentially, and pattern the second metal layer to obtain a gate across the first preliminary pattern ~S3 irradiate the first preliminary pattern and the second preliminary pattern with UV light from above the base substrate by using the gate as a shielding layer, such that a portion of the first preliminary pattern correspondingly located at two side of the gate and respectively connected to the connecting block and the second preliminary pattern is conductorized under UV light irradiation to form a source and a drain spaced apart, the second preliminary pattern is conductorized under the UV light irradiation to form a pixel electrode, and a portion of the first preliminary pattern located between the source and the drain and shielded by the gate forms a semiconductor channel ~S4

FIG. 2

MANUFACTURING METHOD OF TFT SUBSTRATE

FIELD OF INVENTION

The present invention relates to display technology, and more particularly to a manufacturing method of a TFT substrate and a TFT substrate.

BACKGROUND OF INVENTION

In the field of display technology, flat panel displays, such as liquid crystal displays (LCDs) and active matrix organic light-emitting diode (AMOLED) displays, have gradually taken place of cathode ray tube displays, and are widely used in LCD TVs, mobile phones, personal digital assistants, digital cameras, computer screens, or laptop screens.

A display panel is an important part of the LCD and OLED displays. Whether LCD display panel or OLED display panel, there is usually a thin film transistor (TFT) substrate. Taking the LCD display panel as an example, it is mainly composed of a TFT substrate, a color filter (CF) substrate, and a liquid crystal layer disposed between two substrates, and its working principle is to control rotation of liquid crystal molecules in the liquid crystal layer by applying a driving voltage on the TFT substrate and the CF substrate, and the light of a backlight module is refracted to generate a picture. Therefore, the thin film transistors are the main driving components in current LCD and OLED displays, and are directly related to the development direction of high performance flat panel display devices.

The thin film transistors have a plurality of structures, and there are many kinds of material for fabricating active layers of the thin film transistors with corresponding structure, wherein metal oxide thin film transistors (metal oxide TFTs) have advantages of high field effect mobility ($\geq 10$ cm$^2$/V·s), simple fabrication process, good uniformity in large area deposition, fast response speed, and high transmittance in the visible light level. It is considered to be the most promising backplane technology of the development of the display in the direction towards large size and flexibility.

With the increasing resolution of the LCD and OLED displays, the proportion of the thin film transistors per unit area is also increasing. Referring to FIG. 1, in the existing TFT substrate, there are partial overlapping regions between a gate 110 and a source 120, and between the gate 110 and a drain 130 in a direction perpendicular to a substrate 100, resulting in a gate-drain parasitic capacitance Cgd and a gate-source parasitic capacitance Cgs of the thin film transistor, and a ratio relative to the storage capacitance also increases. Therefore, when the aforementioned thin film transistors are applied to a driving circuit of the display panel, a considerable resistance-capacitance loading (RC loading) is often be generated in the signal transmission, resulting in decline in the display quality of the display.

SUMMARY OF INVENTION

The object of the present invention is to provide a manufacturing method of a TFT substrate, which achieves the alignment of a source and drain with a gate by processes of self-alignment of the gate and conductorization of a metal oxide semiconductor layer, and an overlapping region of the source and drain and the gate can be effectively controlled. Thereby, the parasitic capacitance is reduced, and the display quality is improved.

The object of the present invention is also to provide a TFT substrate, which is fabricated by the manufacturing method of the TFT substrate of the present invention. The TFT substrate can effectively control the overlapping region of the source and drain and the gate. Thereby, the parasitic capacitance is reduced, and the display quality is improved.

To achieve the aforementioned object, the present invention provides a manufacturing method of a TFT substrate including the following steps.

A step S1, a base substrate is provided. A metal oxide semiconductor layer is deposited on the base substrate. The metal oxide semiconductor layer is patterned to obtain a first preliminary pattern and a second preliminary pattern connected to a side of the first preliminary pattern.

A step S2, a first metal layer is deposited on the base substrate and the metal oxide semiconductor layer. The first metal layer is patterned to obtain a connecting block connected to another side of the first preliminary pattern. The connecting block is heated. Thereby inducing a portion of the first preliminary pattern in contact with the connecting block to be conductorized.

A step S3, a gate insulating layer is deposited on the base substrate, the metal oxide semiconductor layer, and the first metal layer. A second metal layer is deposited on the gate insulating layer. The second metal layer is patterned to obtain a gate across the first preliminary pattern.

A step S4, the first preliminary pattern and the second preliminary pattern are irradiated with UV light from above the base substrate by using the gate as a shielding layer, such that a portion of the first preliminary pattern correspondingly located at two side of the gate and respectively connected to the connecting block and the second preliminary pattern is conductorized under UV light irradiation to form a source and a drain spaced apart, the second preliminary pattern is conductorized under the UV light irradiation to form a pixel electrode, and a portion of the first preliminary pattern located between the source and the drain and shielded by the gate forms a semiconductor channel.

The step S1 further includes forming an organic photoresist bump on the base substrate before depositing the metal oxide semiconductor. The first preliminary pattern correspondingly covers the organic photoresist bump on the base substrate.

The material of the organic photoresist bump is a light-shielding material.

A height of the organic photoresist bump is greater than 2 µm.

A portion of the first metal layer in contact with the metal oxide semiconductor layer is a metal inducing layer, and a material of the metal inducing layer is aluminum.

The first metal layer after patterning in the step S2 further includes a data line connected to the connecting block.

The second metal layer after patterning in the step S3 further includes a gate line vertically insulated and crossed with the data line and connected to the gate.

The invention further provides a TFT substrate including a base substrate and a metal oxide semiconductor layer, a first metal layer, a gate insulating layer, and a second metal layer sequentially deposited on the base substrate from bottom to top.

The metal oxide semiconductor layer includes a semiconductor channel and a source, a drain, and a pixel electrode which are conductorized.

The first metal layer includes a connecting block connected to the source.

The second metal layer includes a gate correspondingly covering the semiconductor channel.

The pixel electrode is connected to the drain. The source and the drain are respectively connected to the semiconductor channel from both sides of the semiconductor channel and are spaced apart by the semiconductor channel. Opposite inner side edges of the source and the drain are aligned with two side edges of the gate.

The TFT substrate further includes an organic photoresist bump disposed between the base substrate and the metal oxide semiconductor layer. The source, the semiconductor channel, and the drain connected together correspondingly cover the organic photoresist bump.

A material of the organic photoresist bump is a light-shielding material.

A height of the organic photoresist bump is greater than 2 μm.

A portion of the first metal layer in contact with the metal oxide semiconductor layer is a metal inducing layer, and a material of the metal inducing layer is aluminum.

The first metal layer further includes a data line connected to the connecting block.

The second metal layer further includes a gate line vertically insulated and crossed with the data line and connected to the gate.

The beneficial effects of the present invention are as follows. In the manufacturing method of the TFT substrate provided by the present invention, the metal oxide semiconductor layer is irradiated with UV light by using the gate as the shielding layer, such that the portion of the metal oxide semiconductor layer irradiated by the UV light is conductorized to form the source, the drain, and the pixel electrode, and the portion of the metal oxide semiconductor layer shielded by the gate still retains semiconductor properties to form the semiconductor channel. The invention achieves the alignment of the source and the drain with the gate by processes of self-alignment of the gate and conductorization of the metal oxide semiconductor layer, and can effectively control an overlapping region of the source and drain and the gate. Thereby, the parasitic capacitance in the device is reduced, the RC loading when transmitting the signal is reduced, and the display quality is improved. Also, the manufacturing method is simple, and the production efficiency is improved. The TFT substrate of the present invention is fabricated by the aforementioned manufacturing method of the TFT substrate, and can effectively control the overlapping region of the source and drain and the gate. Thereby, the parasitic capacitance in the device is reduced, the RC loading when transmitting the signal is reduced, and the display quality is improved.

DESCRIPTION OF DRAWINGS

The technical solution, as well as other beneficial advantages, of the present invention will become apparent from the following detailed description of an embodiment of the present invention, with reference to the attached drawings. In the drawings:

FIG. 2 is a schematic flowchart of a manufacturing method of a TFT substrate of the present invention.

DETAILED DESCRIPTION OF PREFERRED EMBODIMENTS

To further expound the technical solution adopted in the present invention and the advantages thereof, a detailed description is given to a preferred embodiment of the present invention with reference to the attached drawings.

Referring to FIG. 2, the present invention first provides a manufacturing method of a TFT substrate including the following steps.

Figure 1:
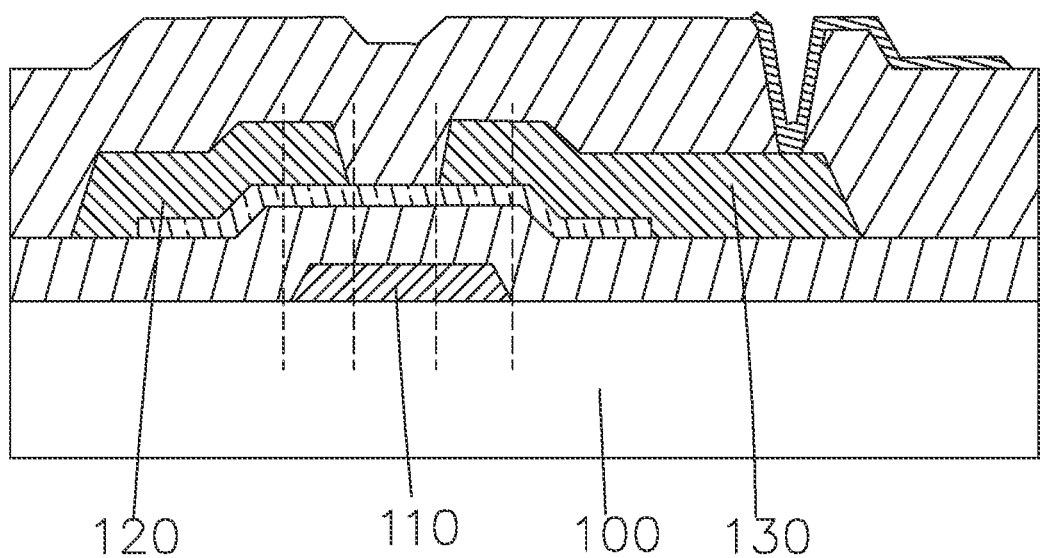
FIG. 1 is a schematic structural view of an existing TFT substrate.
Figure 3:
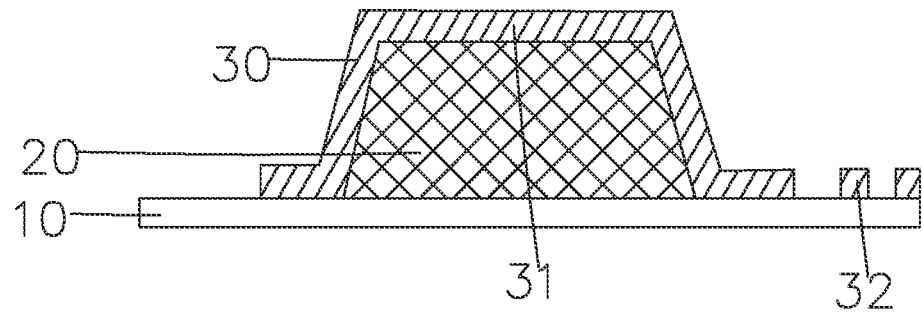
FIG. 3 is a schematic view showing a step S1 of the manufacturing method of the TFT substrate of the present invention.

A step S1, as shown in FIG. 3, a base substrate 10 is provided. An organic photoresist bump 20 is formed on the base substrate 10. A metal oxide semiconductor layer 30 is deposited on the base substrate 10 and the organic photoresist bump 20. The metal oxide semiconductor layer 30 is patterned to obtain a first preliminary pattern 31 correspondingly covering the organic photoresist bump 20 and a second preliminary pattern 33 connected to a side of the first preliminary pattern 31.

Particularly, material of the organic photoresist bump 20 is a light-shielding material, and a height of the organic photoresist bump 20 is greater than 2 μm.

Particularly, in the step S1, a material of the metal oxide semiconductor layer 30 may be indium gallium zinc oxide (IGZO), indium zinc tin oxide (IZTO), or indium gallium zinc tin oxide (IGZTO). In the present embodiment, the metal oxide semiconductor layer 30 is preferably IGZO.

Figure 4:
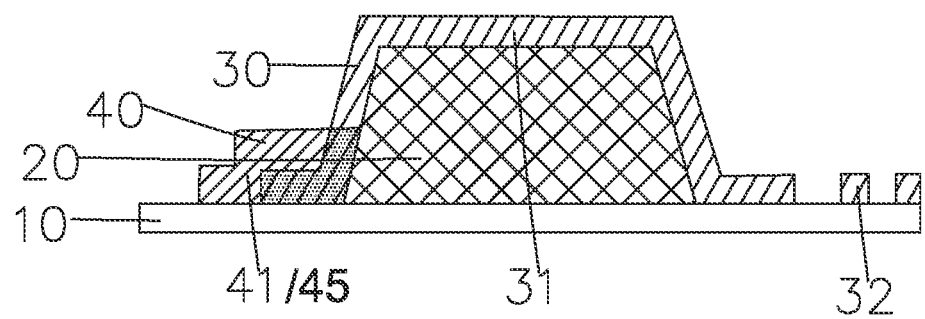
FIG. 4 is a schematic view showing a step S2 of the manufacturing method of the TFT substrate of the present invention.

A step S2, as shown in FIG. 4, a first metal layer 40 is deposited on the base substrate 10 and the metal oxide semiconductor layer 30. The first metal layer 40 is patterned to obtain a data line 45 and a connecting block 41 connected to the data line 45 and the first preliminary pattern 31 on both ends respectively. The connecting block 41 and the second preliminary pattern 33 are respectively connected to opposite sides of the first preliminary pattern 31. Then, the connecting block 41 is heated to induce the first preliminary pattern 31 in contact with the connecting block 41 to be conductorized by the high temperature connecting block 41.

Particularly, a portion of the first metal layer 40 in contact with the metal oxide semiconductor layer 30 is a metal inducing layer which can induce the metal oxide semiconductor layer 30 to be conductorized at high temperature, and a material of the metal inducing layer is aluminum (Al), nickel (Ni), etc. In the present embodiment, the first metal layer 40 is preferably a molybdenum aluminum stacked layer (Mo/Al), wherein the aluminum layer is in contact with the metal oxide semiconductor layer 30.

Figure 5:
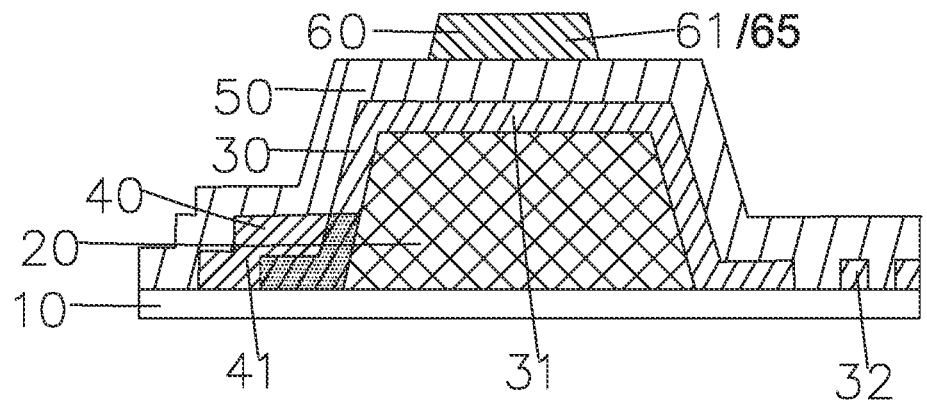
FIG. 5 is a schematic view showing a step S3 of the manufacturing method of the TFT substrate of the present invention.

A step S3, as shown in FIG. 5, a gate insulating layer 50 is deposited on the base substrate 10, the metal oxide semiconductor layer 30, and the first metal layer 40. A second metal layer 60 is deposited on the gate insulating layer 50. The second metal layer 60 is patterned to obtain a gate 61 across the first preliminary pattern 31 and a gate line 65 vertically insulated and crossed with the data line 45 and connected to the gate 61.

Particularly, the gate insulating layer 50 is a silicon oxide layer, a silicon nitride layer, or a combination thereof.

Particularly, the second metal layer 60 and the first metal layer 40 may have the same or different materials.

Figure 6:
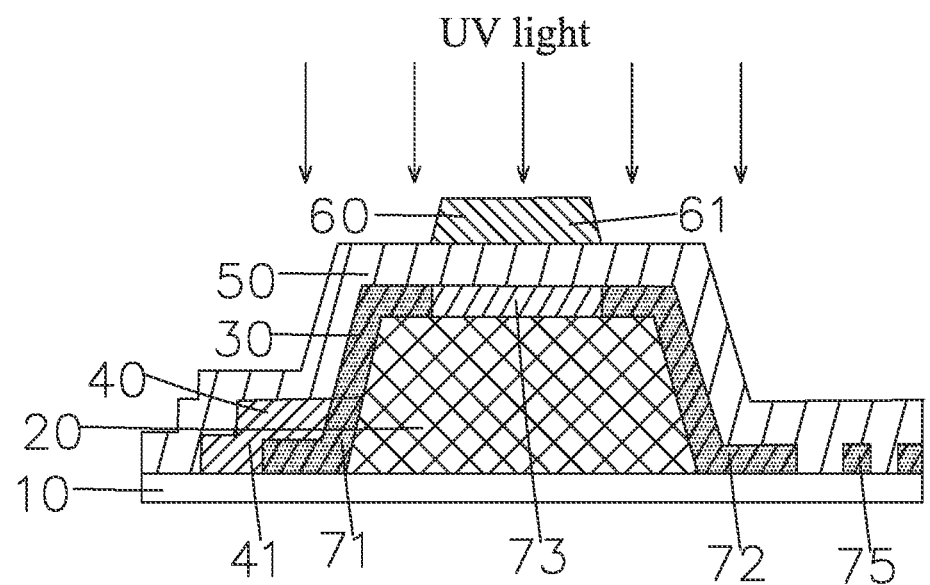
FIG. 6 is a schematic view showing a step S4 of the manufacturing method of the TFT substrate of the present invention, and a schematic structural view of a TFT substrate of the present invention.

A step S4, as shown in FIG. 6, the first preliminary pattern 31 and the second preliminary pattern 32 is irradiated with UV light from above the base substrate 10 by using the gate 61 as a shielding layer, such that a portion of the first preliminary pattern 31 correspondingly located at two side of the gate 61 and respectively connected to the connecting block 41 and the second preliminary pattern 32 is conductorized under UV light irradiation to form a source 71 and a drain 72 spaced apart, the second preliminary pattern 32 is conductorized under UV light irradiation to form a pixel electrode 75, and a portion of the first preliminary pattern 31 located between the source 71 and the drain 72 and shielded by the gate 61 forms a semiconductor channel 73.

Particularly, the pixel electrode 75 has a slit structure including a plurality of strip-shaped branch electrodes spaced apart, and the slits are formed between adjacent strip-shaped branch electrodes.

It should be noted that, since the organic photoresist bump 20 has a certain thickness and the material thereof is a light-shielding material, the semiconductor channel 73 affected by the backlight that damages the semiconductor properties thereof can be avoided by the organic photoresist bump 20 when the TFT substrate is applied to the display panel. Moreover, the convex organic photoresist bump 20 is beneficial to reduce the area occupied by the TFT device on the base substrate 10, thereby increasing an aperture ratio of the TFT substrate.

In the manufacturing method of the TFT substrate of the present invention, the metal oxide semiconductor layer 30 is irradiated with UV light by using the gate as the shielding layer, such that the portion of the metal oxide semiconductor layer 30 irradiated by the UV light is conductorized to form the source 71, the drain 72, and the pixel electrode 75, and the portion of the metal oxide semiconductor layer 30 shielded by the gate 61 still retains the semiconductor properties to form the semiconductor channel 73. The invention achieves the alignment of the source and drain 71/72 with the gate 61 by the processes of self-alignment of the gate and the conductorization of the metal oxide semiconductor layer, and the overlapping region of the source and drain 71/72 and the gate 61 can be effectively controlled. Thereby, the parasitic capacitance is reduced, and the display quality is improved. Also, the manufacturing method is simple, and the production efficiency is improved.

Referring to FIG. 6, based on the manufacturing method of the TFT substrate, the present invention further provides a TFT substrate which is fabricated by the aforementioned manufacturing method of the TFT substrate, and the TFT substrate particularly includes the base substrate 10 and the metal oxide semiconductor layer 30, the first metal layer 40, the gate insulating layer 50, and the second metal layer 60 sequentially deposited on the base substrate 10 from bottom to top.

Particularly, the metal oxide semiconductor layer 30 includes the semiconductor channel 73 and the source 71, the drain 72, and the pixel electrode 75 which are conductorized.

Particularly, the first metal layer 40 includes the data line 45 and the connecting block 41 respectively connected to the data line 45 and the source 71 on both ends, wherein the portion of the source 71 in contact with the connecting block 41 is induced to be conductorized by the heated high temperature connecting block 41.

Particularly, the second metal layer 60 includes the gate correspondingly covering the semiconductor channel 73 and the gate line 65 vertically insulated and crossed with the data line 45 and connected to the gate 61.

Particularly, the source 71, the drain 72, and the pixel electrode 75 which are not covered by the gate 61 and the connecting block 41 are conductorized by the UV light irradiation. The pixel electrode 75 is connected to the drain 72. The source 71 and the drain 72 are respectively connected to the semiconductor channel 73 from both sides of the semiconductor channel 73 and are spaced apart by the semiconductor channel 73. The opposite inner side edges of the source 71 and the drain 72 are aligned with two side edges of the gate 61.

Particularly, The TFT substrate further includes the organic photoresist bump 20 disposed between the base substrate 10 and the metal oxide semiconductor layer 30. The source 71, the semiconductor channel 73, and the drain 72 connected together correspondingly cover the organic photoresist bump 20.

Further, the material of the organic photoresist bump 20 is a light-shielding material, and the height of the organic photoresist bump 20 is greater than 2 µm. Since the organic photoresist bump 20 has the certain thickness and the material thereof is the light-shielding material, the semiconductor channel 73 affected by the backlight that damages the semiconductor properties can be avoided by the organic photoresist bump 20 when the TFT substrate is applied to the display panel. Moreover, the convex organic photoresist bump 20 is beneficial to reduce the area occupied by the TFT device on the base substrate 10, thereby increasing the aperture ratio of the TFT substrate.

Particularly, the material of the metal oxide semiconductor layer 30 may be indium gallium zinc oxide (IGZO), indium zinc tin oxide (IZTO), or indium gallium zinc tin oxide (IGZTO). In the present embodiment, the metal oxide semiconductor layer 30 is preferably IGZO.

Particularly, the portion of the first metal layer 40 in contact with the metal oxide semiconductor layer 30 is a metal inducing layer which can induce the metal oxide semiconductor layer 30 to be conductorized at high temperature, and the material of the metal inducing layer is aluminum, nickel, etc. In the present embodiment, the first metal layer 40 is preferably a molybdenum aluminum stacked layer (Mo/Al), wherein the aluminum layer is in contact with the metal oxide semiconductor layer 30.

Particularly, the gate insulating layer 50 is a silicon oxide layer, a silicon nitride layer, or a combination thereof.

Particularly, the second metal layer 60 and the first metal layer 40 may have the same or different materials.

Particularly, the pixel electrode 75 has a slit structure including a plurality of strip-shaped branch electrodes spaced apart, and the slits are formed between adjacent strip-shaped branch electrodes.

The TFT substrate of the present invention is fabricated by the aforementioned manufacturing method of the TFT substrate, which achieves the alignment of the source and drain 71/72 with the gate 61 by the processes of self-alignment of the gate and the conductorization of the metal oxide semiconductor layer, and the overlapping region of the source and drain 71/72 and the gate 61 can be effectively controlled. Thereby, the parasitic capacitance is reduced, and the display quality is improved. Also, the manufacturing method is simple, and the production efficiency is improved.

In summary, in the manufacturing method of the TFT substrate provided by the present invention, the metal oxide semiconductor layer is irradiated with UV light by using the gate as the shielding layer, such that the portion of the metal oxide semiconductor layer irradiated by the UV light is conductorized to form the source, the drain, and the pixel electrode, and the portion of the metal oxide semiconductor layer shielded by the gate still retains semiconductor properties to form the semiconductor channel. The invention achieves the alignment of the source and drain with the gate by the processes of self-alignment of the gate and the conductorization of the metal oxide semiconductor layer, and can effectively control the overlapping region of the source and drain and the gate. Thereby, the parasitic capacitance in the device is reduced, the RC loading when transmitting the signal is reduced, and the display quality is improved. Also, the manufacturing method is simple, and the production efficiency is improved. The TFT substrate is fabricated by the aforementioned manufacturing method of the TFT substrate, and can effectively control the overlapping region of the source and drain and the gate. Thereby, the parasitic capacitance in the device is reduced, the RC loading when transmitting the signal is reduced, and the display quality is improved.

Based on the description given above, those having ordinary skills of the art may easily contemplate various changes and modifications of the technical solution and technical ideas of the present invention and all these changes and modifications are considered within the protection scope of right for the present invention as defined in the appended claims.

What is claimed is:

1. A manufacturing method of a TFT substrate, comprising:
   a step S1 of providing a base substrate, depositing a metal oxide semiconductor layer on the base substrate, and patterning the metal oxide semiconductor layer to obtain a first preliminary pattern and a second preliminary pattern connected to a side of the first preliminary pattern;
   a step S2 of depositing a first metal layer on the base substrate and the metal oxide semiconductor layer, and patterning the first metal layer to obtain a connecting block connected to another side of the first preliminary pattern, heating the connecting block, thereby inducing a portion of the first preliminary pattern in contact with the connecting block to be conductorized;
   a step S3 of depositing a gate insulating layer on the base substrate, the metal oxide semiconductor layer, and the first metal layer, depositing a second metal layer on the gate insulating layer, and patterning the second metal layer to obtain a gate across the first preliminary pattern;
   a step S4 of irradiating the first preliminary pattern and the second preliminary pattern with UV light from above the base substrate by using the gate as a shielding layer, such that a portion of the first preliminary pattern correspondingly located at two side of the gate and respectively connected to the connecting block and the second preliminary pattern is conductorized under UV light irradiation to form a source and a drain spaced apart, the second preliminary pattern is conductorized under the UV light irradiation to form a pixel electrode, and a portion of the first preliminary pattern located between the source and the drain and shielded by the gate forms a semiconductor channel.

2. The manufacturing method of the TFT substrate according to claim 1, wherein the step S1 further comprises forming an organic photoresist bump on the base substrate before depositing the metal oxide semiconductor layer, and the first preliminary pattern correspondingly covers the organic photoresist bump on the base substrate.

3. The manufacturing method of the TFT substrate according to claim 2, wherein a material of the organic photoresist bump is a light-shielding material;
   and a height of the organic photoresist bump is greater than 2 µm.

4. The manufacturing method of the TFT substrate according to claim 1, wherein a portion of the first metal layer in contact with the metal oxide semiconductor layer is a metal inducing layer, and a material of the metal inducing layer is aluminum.

5. The manufacturing method of the TFT substrate according to claim 1, wherein the first metal layer after patterning in the step S2 further comprises a data line connected to the connecting block;
   the second metal layer after patterning in the step S3 further comprises a gate line vertically insulated and crossed with the data line and connected to the gate.

* * * * *